United States Patent [19]

Teshirogi

[11] 4,086,545
[45] Apr. 25, 1978

[54] PHASE LOCKED LOOP TYPE TRANSMITTER RECEIVER

[75] Inventor: Toshihiko Teshirogi, Machida, Japan

[73] Assignee: Cybernet Electronic Corporation, Kawasaki, Japan

[21] Appl. No.: 777,360

[22] Filed: Mar. 14, 1977

[30] Foreign Application Priority Data

Apr. 7, 1976 Japan .................... 51-39048

[51] Int. Cl.² .............................................. H03B 3/04
[52] U.S. Cl. ...................................... 331/16; 325/421; 331/22
[58] Field of Search ............... 325/419, 420, 421; 331/16, 22, 31

[56] References Cited

U.S. PATENT DOCUMENTS 3,588,731  6/1971  Hoeffer .................................. 331/22

Primary Examiner—John Kominski
Attorney, Agent, or Firm—Oblon, Fisher, Spivak, McClelland & Maier

[57] ABSTRACT

A phase locked loop type transmitter-receiver having a phase locked loop type synthesizer including a circuit in which a programmable counter, a phase discriminator, a low-pass filter, a voltage-controlled oscillator and a mixer are connected in a closed loop; wherein the mixer is connected to a reference oscillator connected to the phase discriminator through a fixed frequency divider, the mixer being adapted to mix frequencies fed from the reference oscillator and the voltage-controlled oscillator thereby synthesizing sum and difference signals thereof, the difference signal being fed to the programmable counter and the sum signal being fed to a transmitting-side mixer and a receiving-side mixer.

2 Claims, 2 Drawing Figures

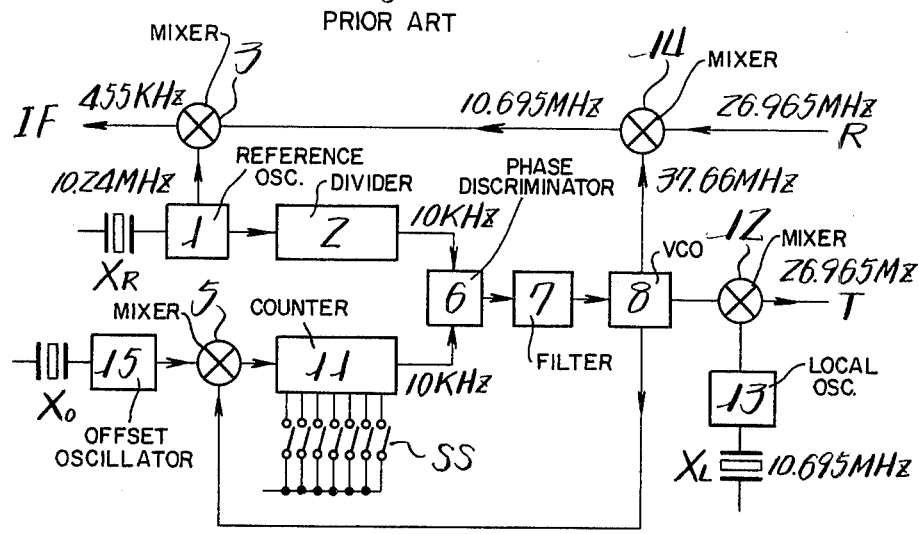

PHASE LOCKED LOOP TYPE TRANSMITTER RECEIVER

BACKGROUND OF THE INVENTION

The present invention relates to a transmitter-receiver and more particularly to a phase locked loop type transmitter-receiver provided with a frequency synthesizer of the phase locked loop type.

A conventional transmitter-receiver provided with a frequency synthesizer of the phase locked loop type will be described with reference to FIG. 1 which shows a circuit diagram thereof by way of example. A reference oscillator 1 equipped with a quartz oscillator $X_R$ applies its reference frequency, for instance, 10.24 MHz, to a fixed frequency divider 2 to divide the frequency into 10 KHz. The offset frequency of No. 1 offset oscillator 15, equipped with quartz oscillator Xo, and the output frequency of a voltage-controlled oscillator 8 are applied to a programmable counter 11 through a mixer 5 and are thereby divided into 10 KHz. The above-mentioned two divided frequencies are applied to a phase discriminator 6 where they are detected; and then the detected signals are fed back via a low pass filter 7 to the above-mentioned voltage-controlled oscillator 8. Thus a closed loop is formed. In such a configuration, however, interference frequencies caused by the intereference between the above oscillators tend to exert adverse influence on the frequency band of the intermediate stage through receiving side mixer 14 and IF mixer 3 during reception; meanwhile, during transmission, the harmonic beat, produced by combining the input frequency, i.e., the reference oscillation frequency and the local oscillation frequency, tends to approach in frequency the output frequency even when the input and output frequencies are considerably different from each other, since the frequency band passed through the transmitting side mixer 12 is comparatively wide, and thus there inherently exists the possibility of the increase in the intensity of spurious emission. Moreover, if two adjacent frequencies, for instance, 17 KHz and 10 KHz, are mixed to synthesize a transmission frequency of 27 MHz, the degrees of the higher harmonics of the respective frequencies will be increased resulting in the increase of the possibility of generating the interfering spurious emission.

SUMMARY OF THE INVENTION

Therefore the primary object of the present invention is to provide a transmitter-receiver of the phase locked loop type which can minimize disturbances due to spurious emission or beats during transmission and reception and can obtain stable carrier waves during transmission and stable local oscillation frequencies during reception.

According to the present invention, there is provided a phase locked loop type transmitter-receiver having a phase locked loop type synthesizer including a circuit in which a programmable counter for converting an input frequency into a desired frequency, a phase discriminator, a low-pass filter, a voltage-controlled oscillator and a mixer are connected in a closed loop; wherein the mixer is connected to a reference oscillator connected to the phase discriminator through a fixed frequency divider, the mixer being adapted to mix frequencies fed from the reference oscillator and the voltage-controlled oscillator thereby synthesizing sum and difference signals thereof, the difference signal being fed to the programmable counter and the sum signal being fed to a transmitting-side mixer and a receiving-side mixer.

BRIEF DESCRIPTION OF THE DRAWINGS

A more complete appreciation of the invention and many of the attendant advantages thereof will be readily obtained as the same becomes better understood by reference to the following detailed description when considered in conjunction with the accompanying drawings, wherein:

FIG. 1 is a circuit diagram of an example of the conventional transmitter-receiver; and FIG. 2 is a circuit diagram of an example of the transmitter-receiver according to the present invention.

DETAILED DESCRIPTION OF THE PREFERRED EMBODIMENTS

The present invention will be hereinafter described in detail with reference to FIG. 2 which shows an example of the present invention and in which the parts corresponding to those in FIG. 1 are designated by the same characters, respectively.

A reference oscillator 1 equipped with a quartz oscillator $X_R$ is adapted to generate a reference frequency of, for instance, 10.24 MHz which is fed as the input frequency. The input frequency is fed to a fixed frequency divider 2 where it is divided down to a frequency of 10 KHz. The input frequency is also fed to a frequency multiplier 4 where it is multiplied n-fold to, for instance, a frequency of 20.48 MHz. Meanwhile, a voltage-controlled oscillator 8 generates an output frequency of 17.18 MHz. Both the multiplied frequency of 20.48 MHz and the output frequency of 17.18 MHz are fed to a mixer 5. The difference signal having a frequency of 3.3 MHz (= 20.48 MHz − 17.18 MHz) produced in the mixer 5 is fed to a programmable counter 11 through a low-pass filter 9, where it is divided down to a frequency of 10 KHz.

The 10 KHz frequencies from the fixed frequency divider 2 and from the programmable counter 11 are applied to a phase discriminator 6 where they are detected; and then the detected signals are fed back to the above-mentioned voltage-controlled oscillator 8 through a low-pass filter 7. Meanwhile, the sum signal having a frequency of 37.66 MHz (= 20.48 MHz + 17.18 MHz) produced in the mixer 5 is passed through a band-pass filter 10 and then is used for synthesizing a carrier wave for transmission as well as a local oscillation frequency for reception. Reference numeral 12 designates a transmitting-side mixer provided in the transmission line between a local oscillator 13 and the receiving stage. Local oscillator 13 is equipped with a quartz oscillator $X_L$ and is adapted to generate a local frequency of, for instance, 10.695 MHz. Reference numeral 14 designates a receiving side mixer to which signals from the antenna of the receiver or an high-frequency amplifier as well as the carrier wave are fed. Reference numeral 3 designates a mixer to which the reference frequency of 10.24 MHz from the reference oscillator 1 and the 10.695 MHz output from the mixer 14 are fed to produce an IF signal at 455 KHz. The reference frequency of the reference oscillator 1 may be fed as it is to the mixer 5, as a matter of course. Accordingly, such a configuration, which mixes the reference frequency with the voltage-controlled oscillation frequency to obtain the sum and difference signals thereof for the purpose of synthesizing frequencies necessary for transmission and reception, may have a great advantage in that it does not use the voltage-controlled oscillation directly unlike the conventional configuration.

As mentioned above, the present invention provides a configuration which mixes the reference frequency or its multiplied frequency with the relatively low voltage-controlled oscillation frequency to obtain the sum and difference signals and does not utilize the voltage-controlled oscillation frequency directly as the carrier or local oscillation frequency, and therefore can achieve a stable operation. In addition, this configuration of the present invention can obtain the sum and difference signals from the mixer 5 simultaneously and effectively, and therefore can synthesize a high carrier frequency in spite of the fact that the voltage-controlled frequency is kept low, and as a result can utilize the upper side-band of the local oscillation frequency of the local oscillator thereby to minimize the interference. In other words, this configuration of the present invention synthesizes a high carrier frequency by mixing a low voltage-controlled oscillation frequency with a low reference frequency, and therefore is stable against the fluctuation of the environmental conditions and can minimize or eliminate spurious emission, interference, etc. during transmission and reception.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A phase locked loop type transmitter-receiver comprising:
   a reference oscillator for generating a first frequency signal;
   a fixed frequency divider connected to the reference oscillator;
   a phase discriminator connected to the fixed frequency divider;
   a low-pass filter connected to the phase discriminator;
   a voltage controlled oscillator connected to the low-pass filter for generating a second frequency signal;
   mixer means connected to the reference oscillator and to the voltage controlled oscillator for mixing the first and second frequencies to synthesize sum and difference signals therof;
   a programmable counter connected between the mixer means and the phase discriminator for dividing the sum signal synthesized by the mixer means;
   a transmitting side mixer connected to the mixer means to receive the sum signal synthesized by the mixer means for synthesizing a carrier wave for transmission; and
   a receiving side mixer connected to the mixer means to receive the sum signal synthesized by the mixer means for synthesizing a local oscillation frequency for reception.

2. The phase locked loop type transmitter-receiver recited in claim 1 including:
   frequency multiplier connected between the reference oscillator and the mixer for multiplying the first frequency signal.

* * * * *